(12) United States Patent
Gibson

(10) Patent No.: US 7,110,321 B1
(45) Date of Patent: Sep. 19, 2006

(54) MULTI-BANK INTEGRATED CIRCUIT MEMORY DEVICES HAVING HIGH-SPEED MEMORY ACCESS TIMING

(75) Inventor: David Stuart Gibson, Suwanee, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 149 days.

(21) Appl. No.: 10/935,518

(22) Filed: Sep. 7, 2004

(51) Int. Cl.
G11C 8/00 (2006.01)
G06F 12/06 (2006.01)
G06F 13/00 (2006.01)
G06F 13/28 (2006.01)
G11C 8/18 (2006.01)
G11C 7/10 (2006.01)

(52) U.S. Cl. .............. 365/233; 365/230.03; 365/233.5; 365/189.02; 365/189.03; 711/5; 711/167; 711/170; 711/202

(58) Field of Classification Search ................ 365/233, 365/233.5
See application file for complete search history.

(56) References Cited

U.S. PATENT DOCUMENTS

| | | |
|---|---|---|
| 5,838,627 A | 11/1998 | Tomishima et al. |
| RE36,236 E | 6/1999 | Shimizu et al. |
| 6,072,744 A | 6/2000 | Kwean |
| 6,160,731 A | 12/2000 | Choi |
| 6,314,011 B1 | 11/2001 | Keeth et al. |
| 6,373,778 B1 * | 4/2002 | Song et al. ............ 365/230.04 |
| 6,396,766 B1 | 5/2002 | Lee |
| 6,569,727 B1 | 5/2003 | Casper et al. |
| 6,597,206 B1 | 7/2003 | Keeth et al. |
| 2004/0240288 A1* | 12/2004 | Takahashi .................... 365/202 |
| 2005/0289428 A1* | 12/2005 | Ong ........................... 714/742 |

OTHER PUBLICATIONS

Virtex, VTT008 (v2.0), High Speed Transceiver Logic (HSTL), May 5, 2001, pp. 1-7.

* cited by examiner

*Primary Examiner*—Amir Zarabian
*Assistant Examiner*—Ly Duy Pham
(74) *Attorney, Agent, or Firm*—Myers Bigel Sibley & Sajovec PA

(57) ABSTRACT

Integrated circuit memory devices support write and read burst modes of operation with uniformly short interconnect paths that provide high-speed memory access timing characteristics. These memory devices include a semiconductor chip having a memory core therein and at least N bond pads thereon. The memory core is configured to support a xN burst-M write mode of operation at QDR and/or DDR rates, where N is greater than four and M is greater than one. The memory core is further configured to support one-to-one mapping between burst-M write data received at each of the N bond pads and corresponding ones of N memory blocks in the memory core during the xN burst-M write mode of operation.

17 Claims, 10 Drawing Sheets

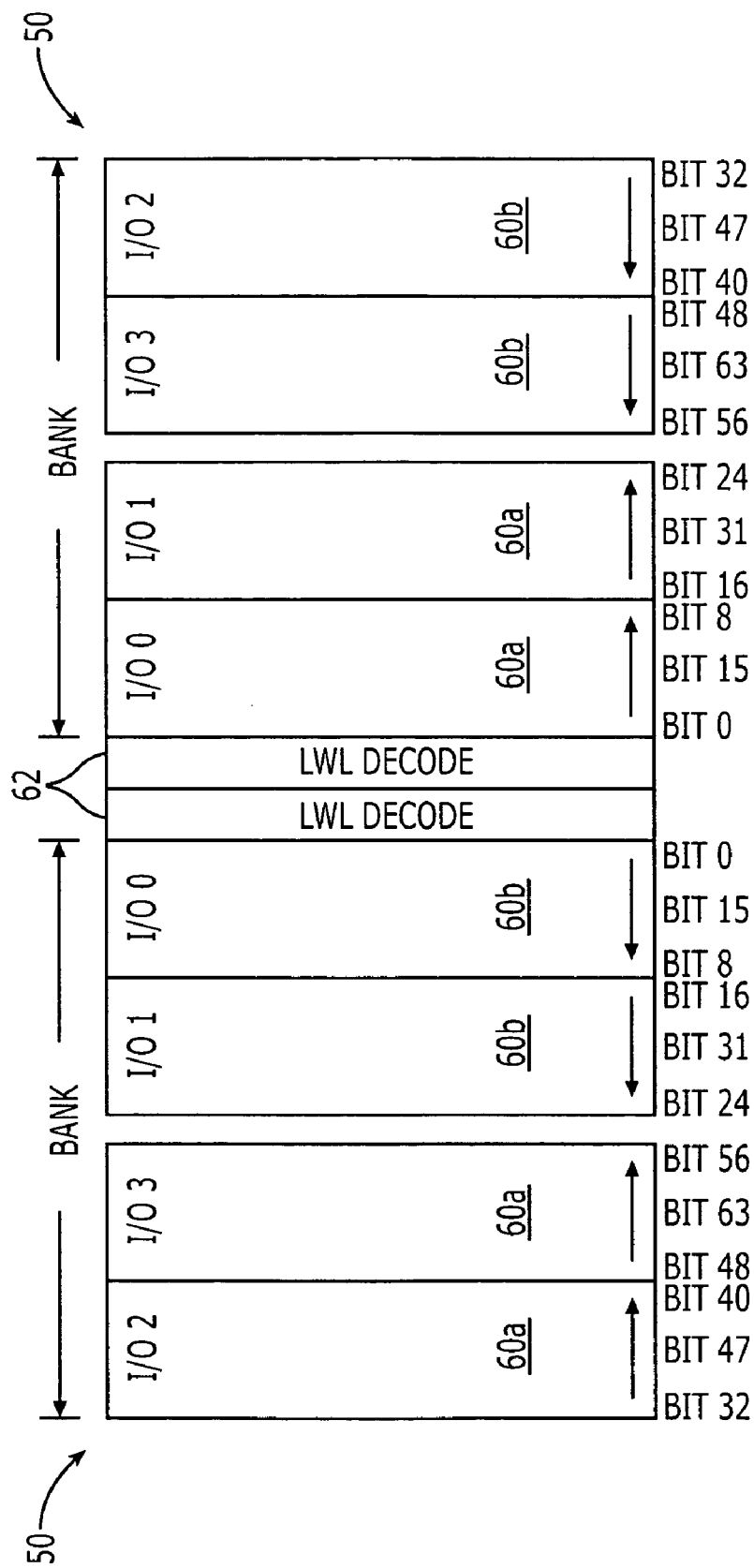

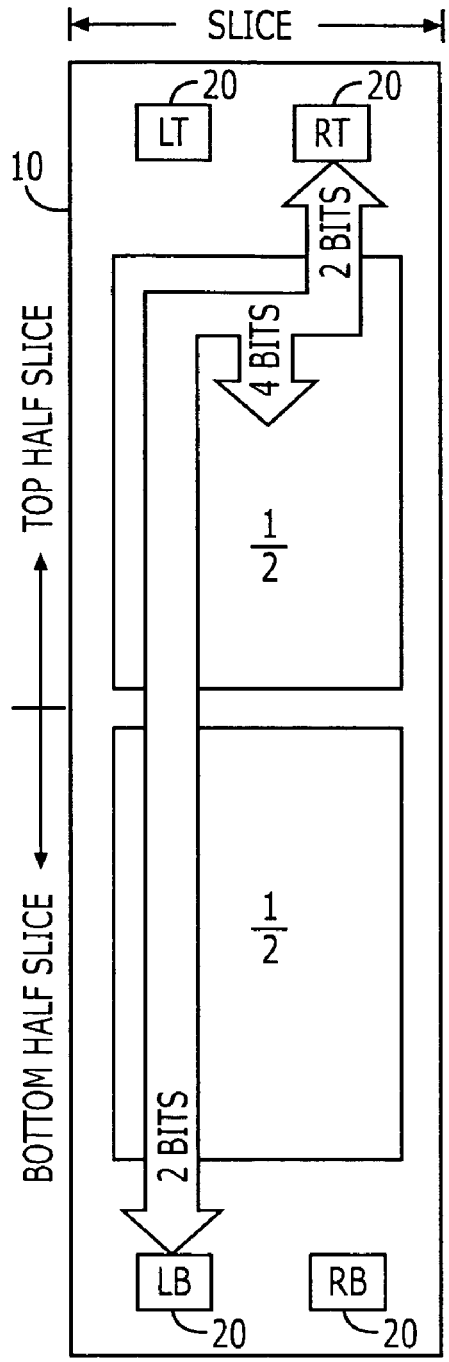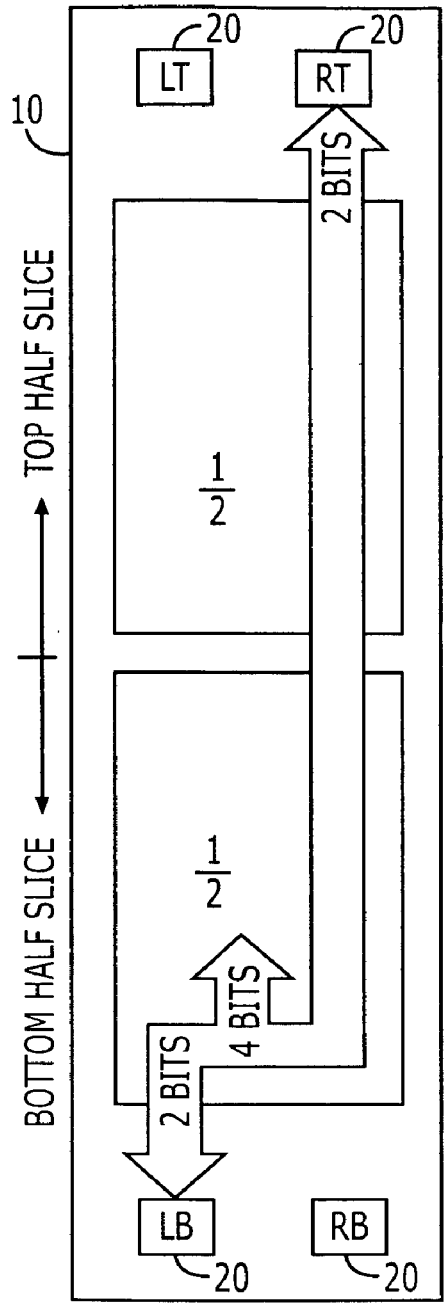
FIG. 3E — X18 BURST 2 (QDR) A<19>=0
FIG. 3F — X18 BURST 2 (QDR) A<19>=1

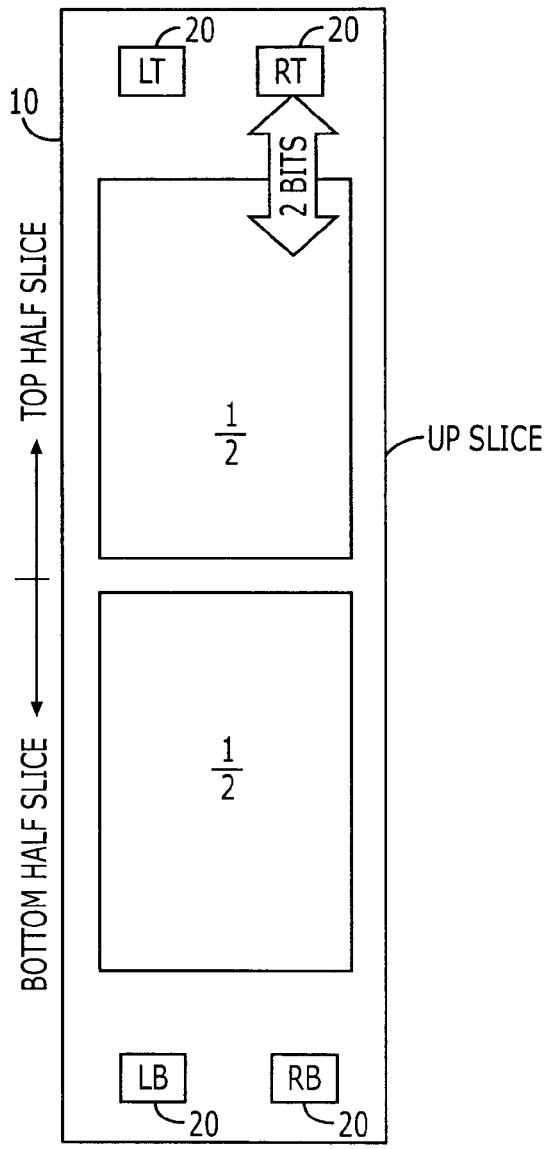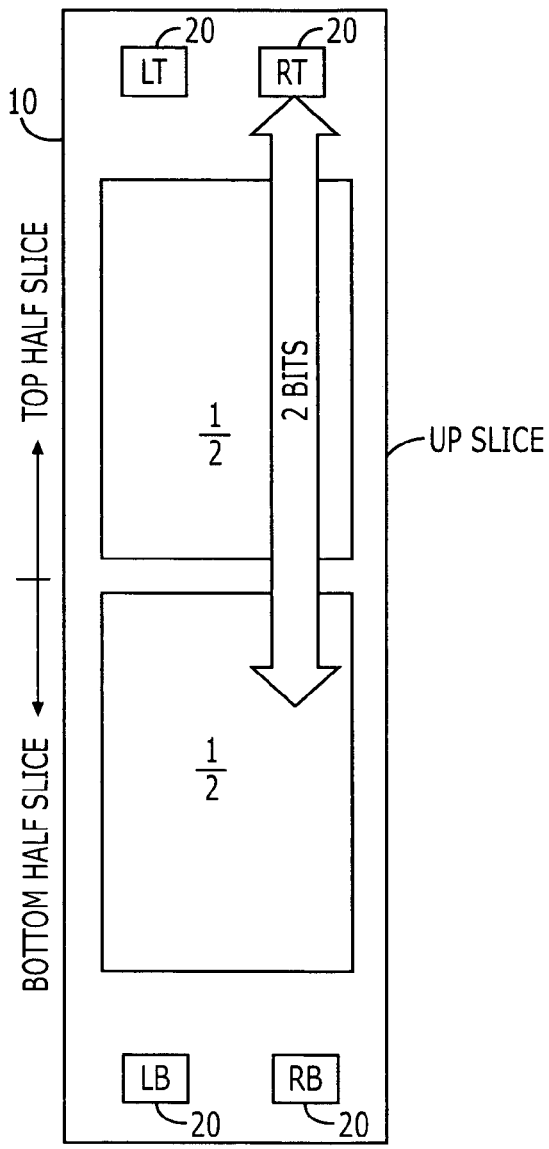
FIG. 3I
FIG. 3J

MULTI-BANK INTEGRATED CIRCUIT MEMORY DEVICES HAVING HIGH-SPEED MEMORY ACCESS TIMING

FIELD OF THE INVENTION

The present invention relates to integrated circuit devices and, more particularly, to multi-bank memory devices.

BACKGROUND OF THE INVENTION

Conventional memory devices are frequently organized to store a plurality of bits of related data in adjacent memory cells that are electrically coupled to a common word line. These memory devices may also include address decoding logic, which can access the common word line during writing and reading operations and thereby direct write data to or read data from a group of the adjacent memory cells. Such conventional decoding logic frequently requires that a plurality of data bits be routed from a corresponding number of bond pads scattered around a periphery of an integrated circuit chip to memory cells associated with a respective word line. These routing operations frequently establish relatively large and nonuniform interconnect paths associated with each of the plurality of data bits being written to or read from an addressed location in the memory device.

Techniques have been developed to limit the degree of nonuniformity of interconnect paths within memory devices. Such techniques include dividing a core of memory cells within a memory device into quadrants, with each quadrant being configured to communicate with a corresponding group of bond pads. Each quadrant may also have independent addressing logic. Other techniques, such as those disclosed in U.S. Pat. No. 6,396,766 to Lee, include using multiplexer logic to reduce the differences between the shortest and longest interconnect paths within a multi-bank memory device.

Notwithstanding these conventional techniques, there continues to be a need for multi-bank memory devices having even faster memory access timing characteristics.

SUMMARY OF THE INVENTION

Integrated circuit memory devices according to embodiments of the present invention support write and read burst modes of operation with uniformly short interconnect paths that provide high-speed memory access timing characteristics. These memory devices include a semiconductor chip having a memory core therein and at least N bond pads thereon. The memory core is configured to support a xN burst-M write mode of operation at QDR and/or DDR rates, where N is greater than four and M is greater than one. The memory core is further configured to support one-to-one mapping between burst-M write data received at each of the N bond pads and corresponding ones of N memory blocks in the memory core during the xN burst-M write mode of operation.

In some embodiments of the present invention, the memory core includes a plurality of UP and DOWN memory slices arranged side-by-side in an alternating UP and DOWN sequence. In these embodiments, the one-to-one mapping precludes write data transfers across boundaries extending between the plurality of UP and DOWN memory slices during the xN burst-M write mode of operation.

According to further embodiments of the present invention, a memory device is provided with a semiconductor substrate having at least N bond pads thereon, where N is at least eight. A memory core is also provided in the substrate. The memory core includes N memory blocks that are each configured to receive write data from corresponding ones of the N bond pads during a xN burst write mode of operation. These N memory blocks include at least a first memory block and a second memory block. The first memory block is configured so that only write data received at a corresponding first one of the N bond pads can be stored in the first memory block during the xN burst write mode of operation and no other ones of the N memory blocks are configured to store data received from the first one of the N bond pads during the xN burst write mode of operation. The second memory block is configured so that only write data received at a corresponding second one of the N bond pads can be stored in the second memory block during the xN burst write mode of operation and no other ones of the N memory blocks are configured to store data received from the second one of the N bond pads during the xN burst write mode of operation.

Still further embodiments of the present invention include a memory chip having a memory core therein. The memory core includes a first multi-bank memory half-slice. This first multi-bank memory half-slice is configured to support a first write operating mode whereby all banks within the first multi-bank memory half-slice only store data received from a first bond pad located adjacent a periphery of the memory chip. The first multi-bank half-slice is further configured to support a second write operating mode whereby all banks within a first half of said first multi-bank memory half-slice (i.e., a quarter slice) only store data received from the first bond pad and all banks within a second half of the first multi-bank memory half-slice only store data received from a second bond pad located adjacent the periphery. This arrangement of memory banks enables the memory core to support write and read modes of operation with uniformly short interconnect paths that provide high-speed memory access timing characteristics.

BRIEF DESCRIPTION OF THE DRAWINGS

FIG. 2C is a block diagram that illustrates an arrangement of a memory I/O blocks within a pair of memory banks illustrated by FIG. 2B.

FIG. 3E is a block diagram that illustrates a plurality of data paths within a slice of the memory core of FIG. 2A, during a x18 burst-2 QDR mode of operation, for the case where the top half of the slice is being accessed.

FIG. 3F is a block diagram that illustrates a plurality of data paths within a slice of the memory core of FIG. 2A, during a x18 burst-2 QDR mode of operation, for the case where the bottom half of the slice is being accessed.

FIG. 3I is a block diagram that illustrates a plurality of data paths within an UP slice of the memory core of FIG. 2A, during a x9 burst-2 QDR mode of operation, for the case where the top half of the slice is being accessed.

FIG. 3J is a block diagram that illustrates a plurality of data paths within an UP slice of the memory core of FIG. 2A, during a x9 burst-2 QDR mode of operation, for the case where the bottom half of the slice is being accessed.

DESCRIPTION OF PREFERRED EMBODIMENTS

Figure 1:
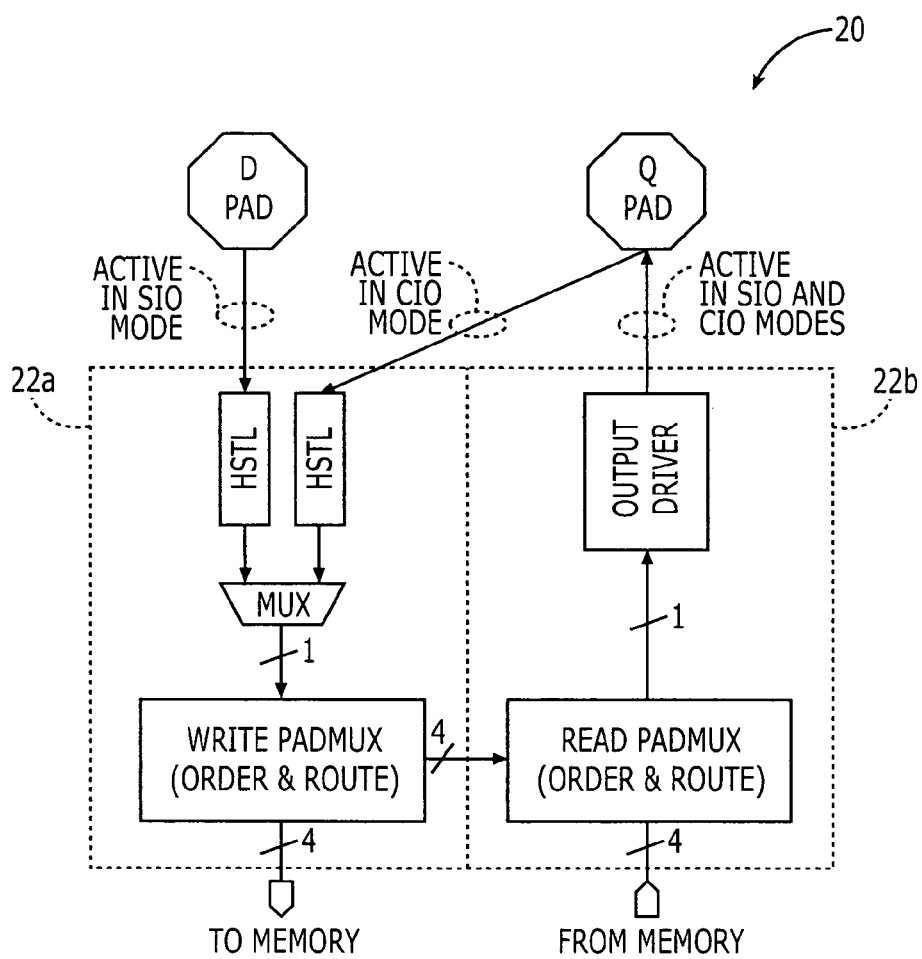
FIG. 1 is a block diagram of a bond pad multiplexing cell according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. Like reference numerals refer to like elements throughout and signal lines and signals thereon may be referred to by the same reference characters.

Figure 2A:
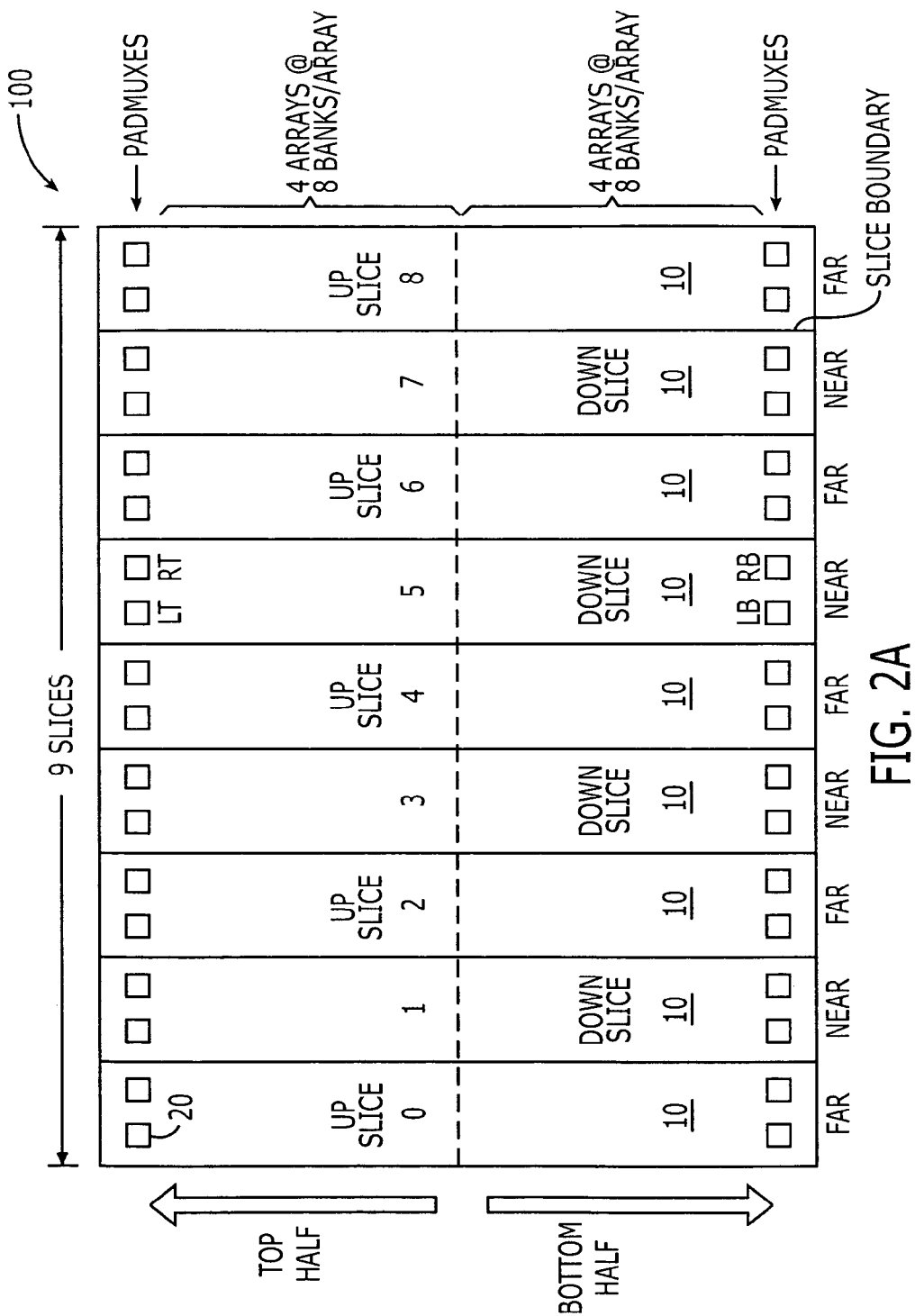
FIG. 2A is a block diagram that illustrates a plurality of slices of a memory core according to embodiments of the present invention.

As illustrated by FIGS. 1 and 2A, an integrated circuit memory device 100 according to embodiments of the present invention includes a plurality of multi-array memory blocks 10 and a plurality of bond pad multiplexing cells 20 (PADMUX) within a memory core. These memory blocks are illustrated as nine (9) UP and DOWN memory slices 10, which are separated by boundaries. An UP memory slice 10 represents a slice that receives data from a single bond pad multiplexing cell 20 located adjacent a first side of the memory device 100 during a xN mode of operation, where N equals the number of slices, and a DOWN memory slice 10 represents a slice that receives data from a single bond pad multiplexing cell 20 located adjacent a second side of the memory device 100 during the xN mode of operation, for those cases where the first and second sides of the memory device 100 are opposite each other.

As described more fully hereinbelow with respect to FIGS. 3A–3J, data does not cross the slice boundaries during read and write operations. Each of the bond pad multiplexing cells 20 is illustrated as including two bond pads (D and Q), which may be positioned at spaced locations along a periphery of an integrated circuit chip, and input and output data routing logic 22a and 22b. As illustrated, the bond pad D is only active as a data input pad during a "separate I/O" mode of operation (SIO). In contrast, the bond pad Q is always active as a data output pad and is also active as a data input pad during a "common I/O" mode of operation (CIO). The SIO mode may be selectively enabled during dual data rate (DDR) burst-2, quad data rate (QDR) burst-2 and QDR burst-4 write modes of operation and the CIO mode may be selectively enabled during DDR burst-4 and DDR burst-2 write modes of operation.

The input data routing logic 22a includes high speed transceiver logic (HSTL) circuits, which buffer incoming write data, and a multiplexer (MUX) that selectively enables a first write data path from the bond pad D or a second write data path from the bond pad Q, in response to a select signal that signifies whether the SIO or CIO mode of operation is active. The input routing logic 22a also includes a write driver circuit configured to drive write data onto an internal data bus associated with a corresponding memory slice 10 during burst write operations. The write driver circuit (shown as WRITE PADMUX) may also be configured to reorder the sequence of incoming write data received at a bond pad (D or Q) during write operations. The output data routing logic 22b is illustrated as including a read buffer circuit (shown as READ PADMUX) and an output driver coupled to the bond pad Q. The read buffer circuit is configured to receive read data from a corresponding internal data bus during burst read operations. The read buffer circuit may also be controlled to perform data reordering operations on read data being output to the bond pad Q. As illustrated, the read buffer circuit may also be configured to receive incoming data directly from the write driver circuit during accelerated memory reading operations, which can occur when a read address received by the memory device 100 matches a write address received within a predetermined number of clock cycles prior to the read address.

Figure 2B:
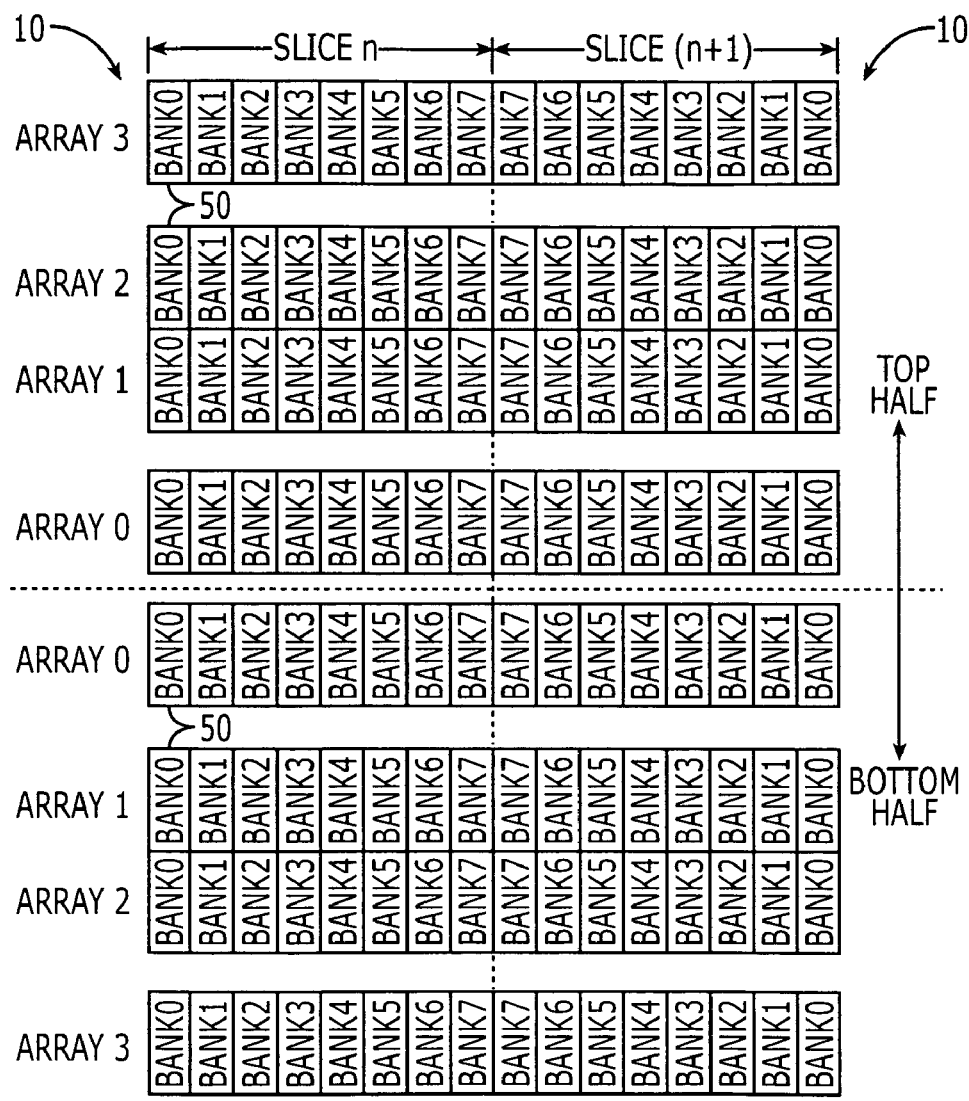
FIG. 2B is a block diagram that illustrates an arrangement of memory arrays and banks within two adjacent slices of the memory core of FIG. 2A.

Each of the UP and DOWN memory slices 10 of FIG. 2A includes two halves (TOP and BOTTOM), with two bond pad multiplexing cells 20 per half. This illustrated configuration of memory slices 10 translates to eight (8) bond pads (D and Q) per memory slice 10, for a total of 72 data bond pads for a memory device 100 containing nine memory slices 10. As illustrated by FIG. 2B, each half of a memory slice 10 includes four memory arrays (ARRAY 0–ARRAY 3), with eight memory banks (BANK 0–BANK 7) being provided within each memory array. As described herein, each pair of bond pad multiplexing cells 20 located adjacent a top half of an UP memory slice represents a "near" (N) pair of PADMUXes and each pair of bond pad multiplexing cells 20 located adjacent a bottom half of an UP memory slice represents a "far" (F) pair of PADMUXes. Likewise, each pair of bond pad multiplexing cells 20 located adjacent a bottom half of an DOWN memory slice represents a "near" (N) pair of PADMUXes and each pair of bond pad multiplexing cells 20 located adjacent a top half of an DOWN memory slice represents a "far" (F) pair of PADMUXes.

Figure 2D:
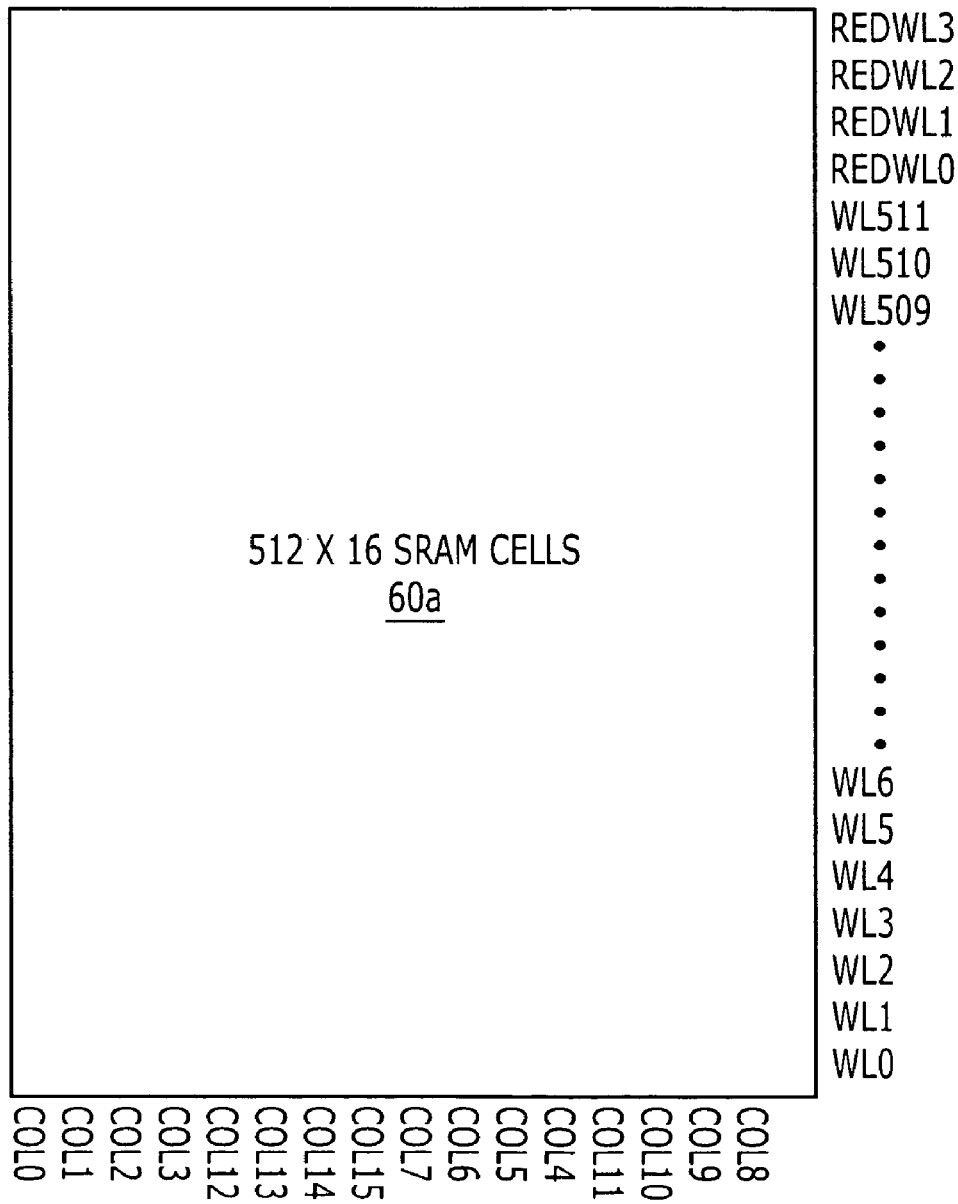
FIG. 2D is a block diagram that illustrates an ordering of rows and columns of memory cells within a I/O memory block.

FIG. 2C illustrates a pair of the adjacent memory banks 50 illustrated by FIG. 2B. Each memory bank 50 includes two "right" I/O memory blocks 60a and two "left" I/O memory blocks 60b, shown as I/O 0–I/O 3. A local word line decoder 62 is electrically coupled to the word lines (WL0–WL511 and REDWL0–REDWL3) within a respective memory bank 50. In FIG. 2D, each right I/O memory block 60a represents a 512×16 array of memory cells (e.g., SRAM memory cells), with four rows of redundancy. The right I/O memory blocks 60a are arranged as mirror images of the left I/O memory blocks 60b.

As illustrated by the address decoding chart of TABLE 1, nine bits of an applied address (i.e., A<8:1> and A<0>) are used for selecting one of the $2^9$=512 word lines within a memory bank 50 and four bits of the applied address (i.e., A<14:11>) are used for selecting one of $2^4$=16 columns within selected I/O memory blocks. In addition, two bits of the applied address (i.e., A<10:9>) are used for selecting one of $2^2=4$ memory arrays within a top half or bottom half of a memory slice 10. As illustrated and described more fully hereinbelow with respect to TABLE 2, three bits of the applied address (i.e., A<20, 16:15>) are used for memory bank(s) selection and two additional bits of the applied address (i.e., A<19:18>) are used for I/O memory block selection and top/bottom selection within a memory slice 10.

TABLE 1

ADDRESS DECODING

| | |
|---|---|
| A<0> | LOCAL WORD LINE SELECT |
| A<8:1> | GLOBAL WORD LINE PAIR SELECT |
| A<10:9> | ARRAY DECODE |
| A<14:11> | COLUMN DECODE |
| A<20, 16:15> | BANK DECODE (SELECTS BANK OR BANKS USED) |
| A<19:18> | IO MEMORY BLOCK AND TOP/BOTTOM SELECT |

Figure 3A:
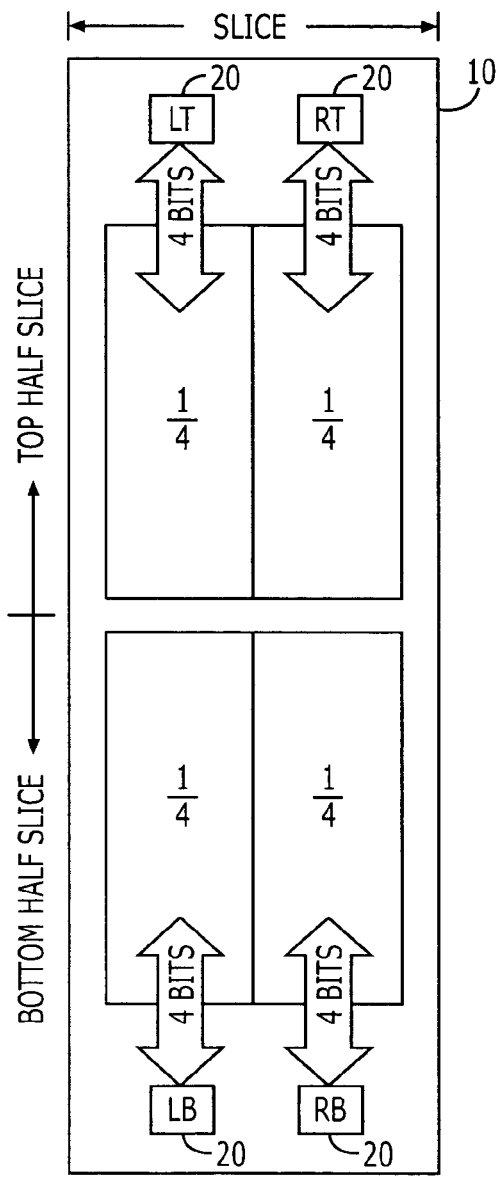
FIG. 3A is a block diagram that illustrates a plurality of data paths within a slice of the memory core of FIG. 2A, during a x36 burst-4 mode of operation.

Operation of the memory device 100 of FIG. 2A during x36, x18 and x9 write (or read) modes will now be described more fully with reference to FIGS. 3A–3J and the memory map chart of TABLE 2. FIG. 3A illustrates the routing of data (write or read) within each memory slice 10 when the memory device 100 is disposed in a x36 burst-4 mode of operation (i.e., the memory device 100 is receiving (or generating) 144=36×4 bits of data at 36 data bond pads (D or Q), in response to a single write (or read) instruction). This routing of data occurs across uniform data traversal paths within each quarter memory slice. During a x36 burst-4 write mode of operation (QDR with SIO operation or DDR with CIO operation), each of the four bond pad multiplexing cells 20 (shown as LT, RT at the top half of the memory slice 10 and LB, RB at bottom half of the memory slice 10) provides write data to only a corresponding "nearest" quarter memory slice (¼) within the illustrated memory slice 10 and vice versa during a x36 burst-4 read mode of operation. Thus, during a x36 burst-4 mode of operation, there is a one-to-one data mapping between each bond pad multiplexing cell 20 and a corresponding nearest quarter memory slice (¼) within the illustrated memory slice 10. Each of these nearest quarter memory slices represents one of memory blocks within the memory device 100. Moreover, data does not cross any memory slice boundary during reading and writing operations.

Figure 3B:
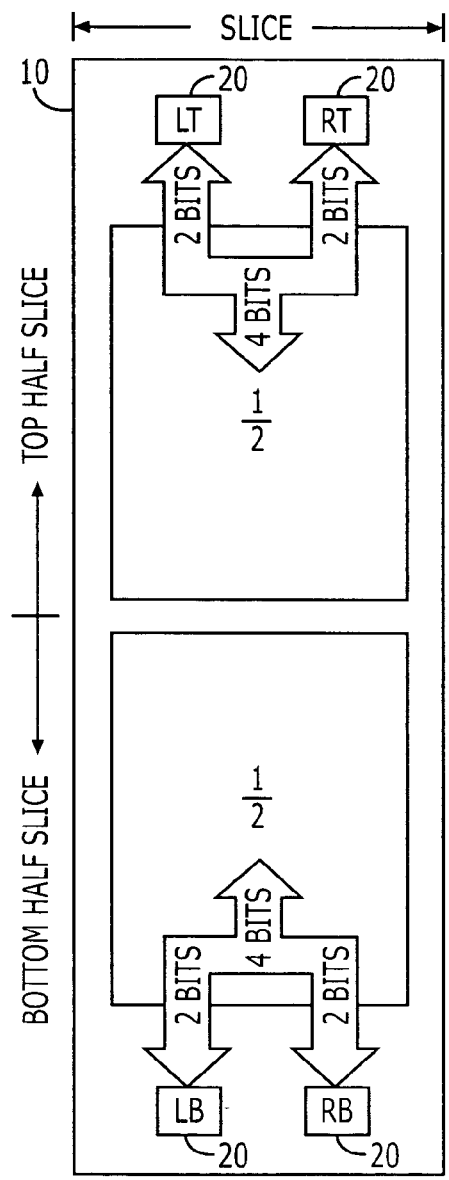
FIG. 3B is a block diagram that illustrates a plurality of data paths within a slice of the memory core of FIG. 2A, during a x36 burst-2 mode of operation.

FIG. 3B illustrates the routing of data (write or read) within each memory slice 10 when the memory device 100 is disposed in a x36 burst-2 mode of operation (i.e., the memory device 100 is receiving (or generating) 72=36×2 bits of data at 36 data bond pads (D or Q), in response to a single write (or read) instruction). During a x36 burst-2 write mode of operation (QDR with SIO operation or DDR with CIO operation), each pair of the four bond pad multiplexing cells 20 (shown as LT, RT and LB, RB) provides write data to only a corresponding "nearest" top or bottom half slice within the illustrated memory slice 10.

Figure 3C:
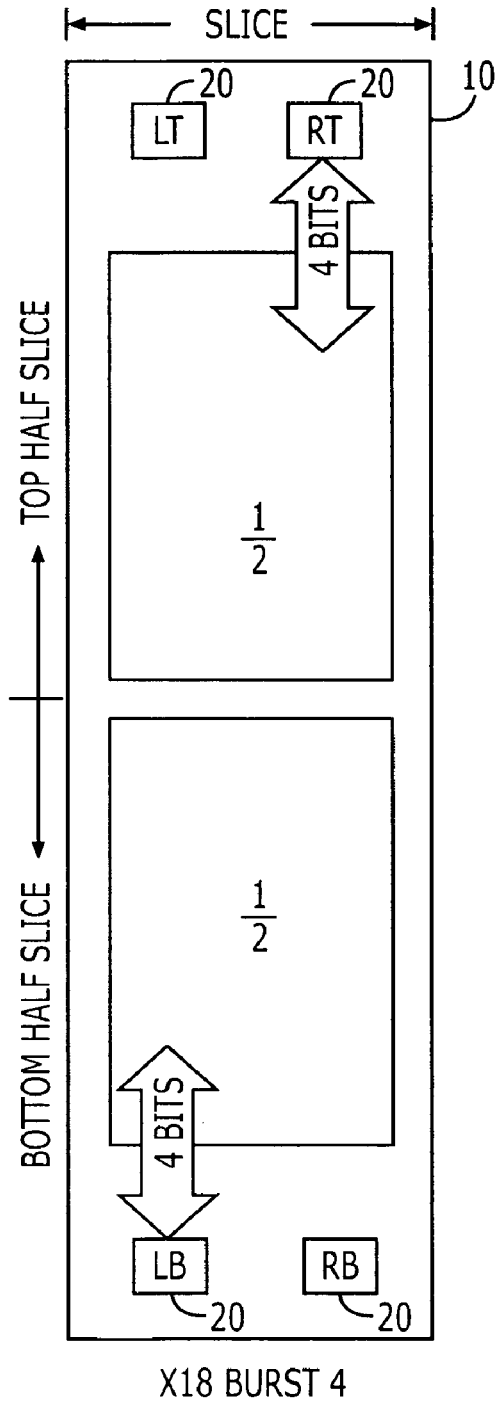
FIG. 3C is a block diagram that illustrates a plurality of data paths within a slice of the memory core of FIG. 2A, during a x18 burst-4 mode of operation.

FIG. 3C illustrates the routing of data (write or read) within each memory slice 10 when the memory device 100 is disposed in a x18 burst-4 mode of operation (i.e., the memory device 100 is receiving (or generating) 72=18×4 bits of data at 18 data bond pads (D or Q), in response to a single write (or read) instruction). During a x18 burst-4 write mode of operation, the right top (RT) bond pad multiplexing cell 20 provides write data to only a corresponding top half slice and the left bottom (LB) bond pad multiplexing cell 20 provides write data to only a corresponding bottom half slice. Thus, during a x18 burst-4 mode of operation, there is a one-to-one data mapping between the right top (RT) bond pad multiplexing cell 20 and the nearest top half slice and a similar one-to-one data mapping between the left bottom (LB) bond pad multiplexing cell 20 and the nearest bottom half slice.

Figure 3D:
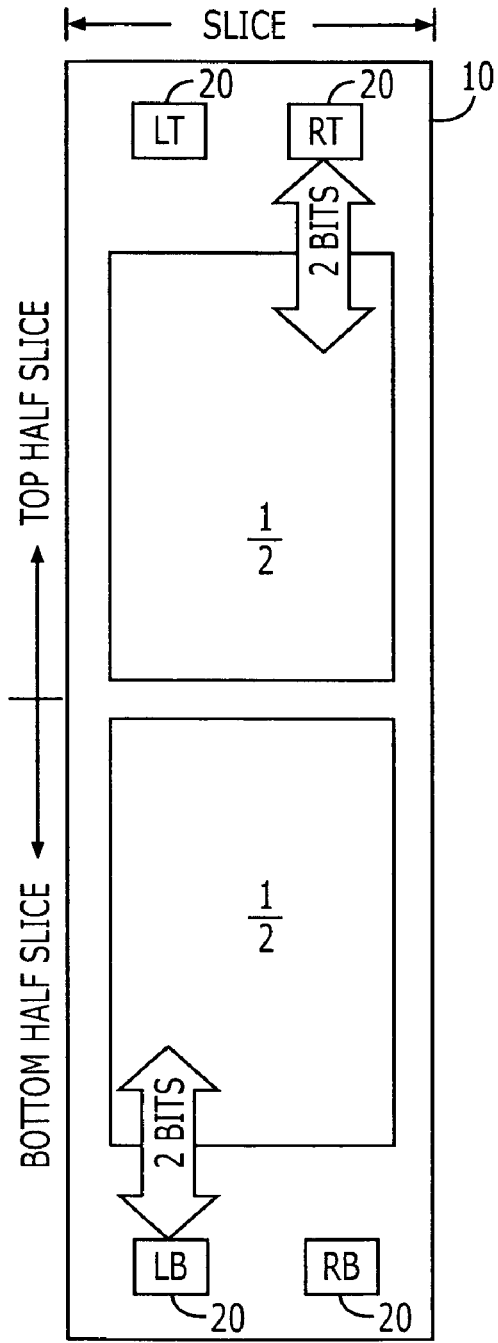
FIG. 3D is a block diagram that illustrates a plurality of data paths within a slice of the memory core of FIG. 2A, during a x18 burst-2 DDR mode of operation.

FIG. 3D illustrates the routing of data (write or read) within each memory slice 10 when the memory device 100 is disposed in a x18 DDR burst-2 mode of operation (i.e., the memory device 100 is receiving (or generating) 36=18×2 bits of data at 18 data bond pads (D or Q), in response to a single write (or read) instruction). During a x18 DDR burst-2 write mode of operation, the right top (RT) bond pad multiplexing cell 20 provides write data to only a corresponding top half slice and the left bottom (LB) bond pad multiplexing cell 20 provides write data to only a corresponding bottom half slice. Thus, during a x18 DDR burst-2 mode of operation, there is a one-to-one data mapping between the right top (RT) bond pad multiplexing cell 20 and the nearest top half slice and a similar one-to-one data mapping between the left bottom (LB) bond pad multiplexing cell 20 and the nearest bottom half slice.

FIGS. 3E–3F illustrate the routing of data (write or read) within each memory slice 10 when the memory device 100 is disposed in a x18 QDR burst-2 mode of operation (i.e., the memory device 100 is receiving (or generating) 36=18×2 bits of data at 18 data bond pads (D or Q), in response to a single write (or read) instruction). During a x18 QDR burst-2 write mode of operation, the right top (RT) bond pad multiplexing cell 20 and the left bottom (LB) bond pad multiplexing cell 20 in FIG. 3E collectively provide only the top half slice with write data for the case where the address bit A<19>=0. Likewise, in FIG. 3F, the right top (RT) bond pad multiplexing cell 20 and the left bottom (LB) bond pad multiplexing cell 20 collectively provide only the bottom half slice with write data for the case where the address bit A<19>=1.

Figure 3G:
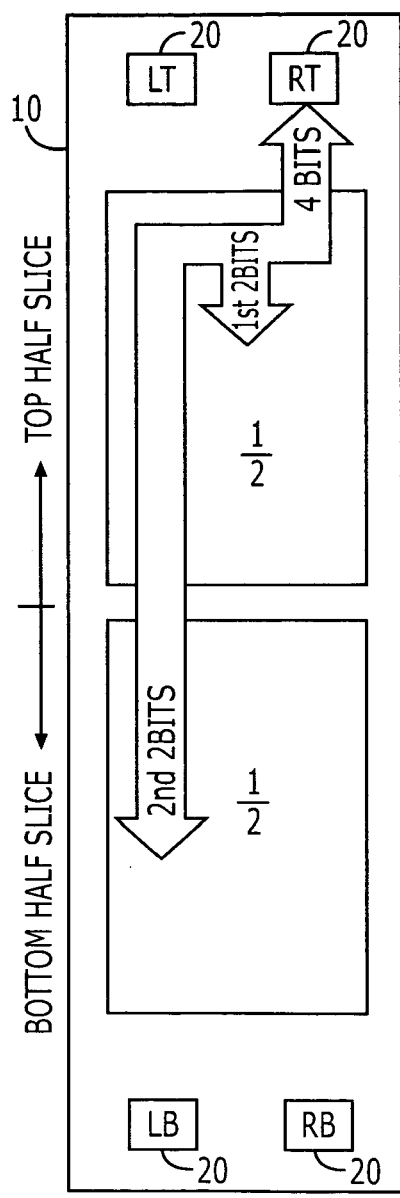
FIG. 3G is a block diagram that illustrates a plurality of data paths within an UP slice of the memory core of FIG. 2A, during a x9 burst-4 mode of operation.

FIG. 3G illustrates the routing of data (write or read) within each UP memory slice 10 when the memory device 100 is disposed in a x9 burst-4 mode of operation (i.e., the memory device 100 is receiving (or generating) 36=9×4 bits of data at 9 data bond pads (D or Q), in response to a single write (or read) instruction). During a x9 burst-4 write mode of operation, the right top (RT) bond pad multiplexing cell 20 provides half of its write data ($1^{st}$ 2 bits) to the top half slice and another half of its write data ($2^{nd}$ 2 bits) to the bottom half slice. Alternatively, during a x9 burst-4 read mode of operation, the right top (RT) bond pad multiplexing cell 20 receives the first half of the read data from the "near" top half slice and the second half of the read data from the "far" bottom half slice. In this manner, at least some of the read latency associated with reading data from the bottom half slice, which is farther away from the right top bond pad multiplexing cell 20 relative to the top half slice, can be hidden from the overall read timing while the first half of the read data is being output through the right top (RT) bond pad multiplexing cell 20. Analogous operations are also provided with respect to each DOWN memory slice 10.

Figure 3H:
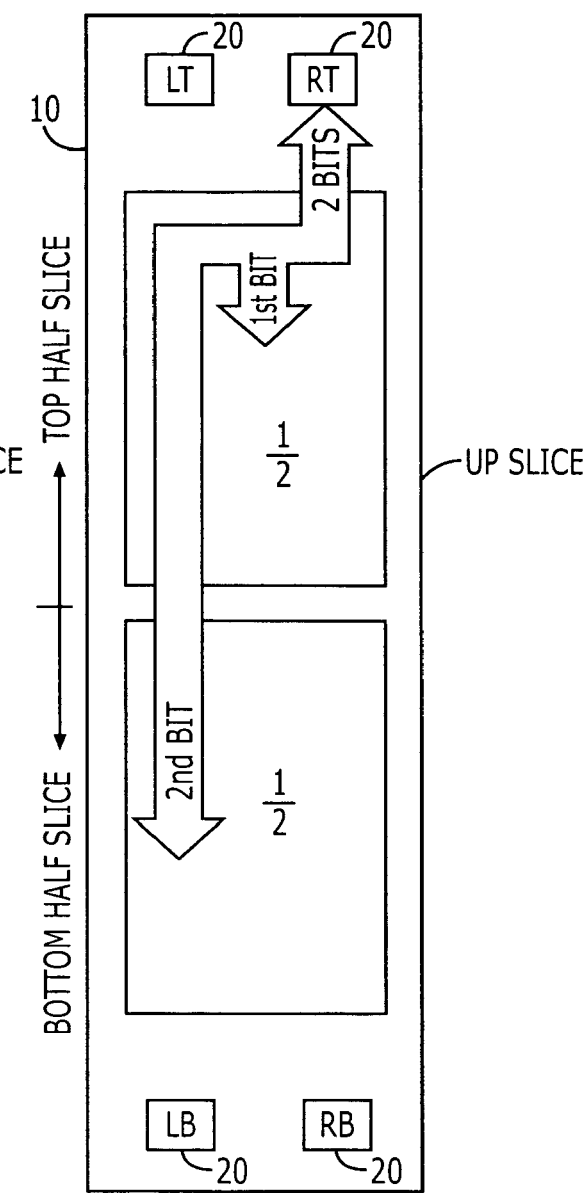
FIG. 3H is a block diagram that illustrates a plurality of data paths within an UP slice of the memory core of FIG. 2A, during a x9 burst-2 DDR mode of operation.

FIG. 3H illustrates the routing of data (write or read) within each UP memory slice 10 when the memory device 100 is disposed in a x9 DDR burst-2 mode of operation (i.e., the memory device 100 is receiving (or generating) 18=9×2 bits of data at 9 data bond pads (D or Q), in response to a single write (or read) instruction). During a x9 DDR burst-2 write mode of operation, the right top (RT) bond pad multiplexing cell 20 provides half of its write data ($1^{st}$ of 2 bits) to the top half slice and another half of its write data ($2^{nd}$ of 2 bits) to the bottom half slice. Alternatively, during a x9 burst-2 read mode of operation, the right top (RT) bond pad multiplexing cell 20 receives the first half of the read data from the "near" top half slice and the second half of the read data from the "far" bottom half slice. In this manner, at least some of the read latency associated with reading data from the bottom half slice, which is farther away from the right top bond pad multiplexing cell 20 relative to the top half slice, can be hidden from the overall read timing while the first half of the read data is being output through the right top (RT) bond pad multiplexing cell 20. Analogous operations are also provided with respect to each DOWN memory slice 10.

FIG. 3I illustrates the routing of data (write or read) within each UP memory slice 10 when the memory device 100 is disposed in a x9 QDR burst-2 mode of operation (i.e., the memory device 100 is receiving (or generating) 18=9×2 bits of data at 9 data bond pads (D or Q), in response to a single write (or read) instruction). During a x9 QDR burst-2 write mode of operation, the right top (RT) bond pad multiplexing cell 20 provides all write data to the top half slice for the case where the address bit A<19>=0. Thus, during a x9 QDR burst-2 mode of operation, there is a one-to-one data mapping between the right top (RT) bond pad multiplexing cell 20 and the nearest top half slice for the case of an UP memory slice. Analogous operations are also provided with respect to each DOWN memory slice 10.

FIG. 3J illustrates the routing of data (write or read) within each UP memory slice 10 when the memory device 100 is disposed in a x9 QDR burst-2 mode of operation for the case where the address bit A<19>=1. During this x9 QDR burst-2 write mode of operation, the right top (RT) bond pad multiplexing cell 20 provides all write data to the bottom half slice. Analogous operations are also provided with respect to each DOWN memory slice 10.

TABLE 2 illustrates a memory map chart for address bits A<20:18>. This table supplements the address decoding chart of TABLE 1. For the case of QDR and DDR x36 burst-4 modes of operation illustrated by FIG. 3A, the address bits A<20:18> are unused and do not influence the routing of data into the quarter slices illustrated by FIG. 3A. However, the address bits A<16:15> are used to select one of four banks within a selected array (ARRAY 0–ARRAY 3) within a quarter memory slice. These four banks correspond to BANK 0–BANK 3 for the top (or bottom) left quarter slice illustrated in FIG. 3A and BANK 4–BANK 7 for the top (or bottom) right quarter slice. For the case of QDR and DDR x36 burst-2 modes of operation illustrated by FIG. 3B, the address bits A<20, 16:15> are used to select one of eight banks within a selected memory array (array selected by A<10:9>), however, the address bits A<19:18> are unused and do not influence the routing of data into the half slices illustrated by FIG. 3B.

TABLE 2

| MEMORY MAP CHART for A<20:18> | | | | | | | | | |
|---|---|---|---|---|---|---|---|---|---|
| | | | x36 | | | | x18 | | x9 |
| MODE | A<19> | A<18> | LN | RN | LF | RF | NEAR | FAR | NEAR |
| DDR_b4 | | | — | | | | A<20> | | A<20:19> |
| key | | | abcd | abcd | abcd | abcd | abcd | abcd | ab | cd |
| | 0 | — | 0123N | 0123N | 0123F | 0123F | 0123N | 0123F | 01N | 01F |
| | 1 | — | 0123N | 0123N | 0123F | 0123F | 0123N | 0123F | 23N | 23F |
| DDR_b2 | | | A20 | | | | A<20:19> | | A<20:18> |
| key | | | ab | ab | ab | ab | ab | ab | a | b |
| | 0 | 0 | 23N | 01N | 23F | 01F | 01N | 01F | 0N | 0F |
| | 0 | 1 | 23N | 01N | 23F | 01F | 01N | 01F | 1N | 1F |
| | 1 | 0 | 23N | 01N | 23F | 01F | 23N | 23F | 2N | 2F |
| | 1 | 1 | 23N | 01N | 23F | 01F | 23N | 23F | 3N | 3F |
| QDR_b4 | | | — | | | | A20 | | A<20:19> |
| key | | | abcd | abcd | abcd | abcd | abcd | abcd | ab | cd |
| | 0 | — | 0123N | 0123N | 0123F | 0123F | 0123N | 0123F | 01N | 01F |
| | 1 | — | 0123N | 0123N | 0123F | 0123F | 0123N | 0123F | 23N | 23F |
| QDR_b2 | | | A20 | | | | A<20:19> | | A<20:18> |
| key | | | ab | ab | ab | ab | ab | ab | ab | |
| | 0 | 0 | 23N | 01N | 23F | 01F | 01T | 23T | 01T | |
| | 0 | 1 | 23N | 01N | 23F | 01F | 01T | 23T | 23T | |
| | 1 | 0 | 23N | 01N | 23F | 01F | 01B | 23B | 01B | |
| | 1 | 1 | 23N | 01N | 23F | 01F | 01B | 23B | 23B | | key:
a = IO block used for first bit of burst
b = IO block used for second bit of burst
c = IO block used for third bit of burst
d = IO block used for fourth bit of burst
N = data stored in "near" side (i.e., TOP for UP slice, BOTTOM for DOWN slice)
F = data stored in "far" side (i.e., BOTTOM for UP slice, TOP for DOWN slice)
T = data stored in top half of slice
B = data stored in bottom half of slice For the case of QDR and DDR x18 burst-4 modes of operation, the address bits A<20, 16:15> are used to select one of eight banks within a selected memory array. However, the address bits A<19:18> are unused and do not influence the routing of data into the half slices illustrated by FIG. 3C. For the case of DDR x18 burst-2 modes of operation illustrated by FIG. 3D, the address bits A<20, 16:15> are used to select one of eight banks and the address bit A<19> is used to select a pair of I/O memory blocks (01 or 23) within a selected bank. For the case of QDR x18 burst-2 modes of operation illustrated by FIGS. 3E and 3F, the address bits A<20, 16:15> are used to select one of eight banks within an array and the address bit A<19> is used to select a top or bottom half of a corresponding memory slice 10.

For the case of QDR and DDR x9 burst-4 modes of operation illustrated by FIG. 3G, the address bits A<20, 16:15> are used to select one of eight banks and the address bit A<19> is used to select a pair of I/O memory blocks (01 or 23) within a selected bank. For the case of DDR x9 burst-2 modes of operation illustrated by FIG. 3H, the address bits A<20, 16:15> are used to select one of eight banks and the address bits A<19:18> are used to select one of the four I/O memory blocks (I/O 0, I/O 1, I/O 2 or I/O 3) within a selected bank. Finally, for the case of QDR x9 burst-2 modes of operation illustrated by FIGS. 31 and 3J, the address bits A<20, 16:15> are used to select one of eight banks, the address bit A<18> is used to select a pair of I/O memory blocks (01 or 23) and the address bit A<19> is used to select a top or bottom half of a corresponding memory slice 10.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device, comprising:
    a semiconductor chip having a memory core therein and at least N bond pads thereon, said memory core configured to support a xN burst-M write mode of operation at QDR and/or DDR rates and further configured to support one-to-one mapping between burst-M write data received at each of the N bond pads and corresponding ones of N memory blocks in said memory core during the xN burst-M write mode of operation, where N is an integer greater than four and M is an integer greater than one.

2. The memory device of claim 1, wherein N is at least eighteen and M is greater than two.

3. The memory device of claim 1, wherein the memory core comprises a plurality of UP and DOWN memory slices arranged side-by-side in an alternating UP and DOWN sequence.

4. The memory device of claim 3, wherein the one-to-one mapping precludes write data transfers across boundaries extending between the plurality of UP and DOWN memory slices during the xN burst-M write mode of operation.

5. The memory device of claim 3, further comprising a plurality of bond pad multiplexing cells at each end of the plurality of UP and DOWN memory slices.

6. The memory device of claim 5, wherein a first of the plurality of bond pad multiplexing cells comprises an input data routing logic circuit and an output data routing logic circuit; and wherein said output data routing logic circuit is configured to receive read data from a corresponding one of the plurality of UP and DOWN memory slices and further configured to receive data directly from the input data routing logic circuit.

7. The memory device of claim 5, wherein a first one of the plurality of bond pad multiplexing cells comprises:
    first bond pad that is active as a data input pad during a separate IO mode of operation and is inactive during a common IO mode of operation; and
    a second bond pad that is active as a data output pad during separate and common IO modes of operation and active as a data input pad during the common IO mode of operation.

8. The memory device of claim 3, wherein the plurality of UP and DOWN memory slices are configured to support all combinations of xN, x2N and x4N DDR and QDR write modes of operation.

9. The memory device of claim 1, wherein the N memory blocks include:
    a first memory block configured so that only write data received at a corresponding first one of the N bond pads can be stored in the first memory block during the xN burst-M write mode of operation and no other ones of the N memory blocks are configured to store data received from the first one of the N bond pads during the xN burst-M write mode of operation; and
    a second memory block configured so that only write data received at a corresponding second one of the N bond pads can be stored in the second memory block during the xN burst-M write mode of operation and no other ones of the N memory blocks are configured to store data received from the second one of the N bond pads during the xN burst-M write mode of operation.

10. The memory device of claim 9, wherein the xN burst-M write mode of operation is a xN burst-4 write mode of operation.

11. The memory device of claim 1, wherein the memory core comprises a plurality of multi-bank memory blocks configured to receive write data from the N bond pads, said plurality of multi-bank memory blocks comprising:
    a first multi-bank memory block configured to support a first write operating mode wherein all banks within the first multi-bank memory block only store data received from a first one of the N bond pads and no banks within any other ones of said plurality of multi-bank memory blocks store data received from the first one of the N bond pads; and
    a second multi-bank memory block configured to support the first write operating mode wherein all banks within the second multi-bank memory block only store data received from a second one of the N bond pads and no banks within any other ones of said plurality of multi-bank memory blocks store data received from the second one of the N bond pads.

12. An integrated circuit memory device, comprising:
    a semiconductor chip having a memory core therein and at least 4N bond pads thereon, said semiconductor chip configured to support a plurality of write modes of operation including at least a xN burst-M QDR write mode of operation, a xN burst-M DDR write mode of operation, a x2N burst-M QDR write mode of operation, a x2N burst-M DDR write mode of operation, a x4N burst-M QDR write mode of operation and a x4N burst-M DDR write mode of operation, where N is an integer greater than four and M is an integer greater than one.

13. The memory device of claim 12, wherein the plurality of write modes of operation supported by said semiconductor chip also include a xN burst-2M write mode of operation, a x2N burst-2M write mode of operation and a x4N burst-2M write mode of operation.

14. The memory device of claim 13, wherein said semiconductor chip is responsive to a plurality of address bits, which operate to select a designated write mode of operation from the plurality of write modes of operation.

15. The memory device of claim 8, wherein none of the xN, x2N and x4N DDR and QDR write modes of operation support data transfers across boundaries extending between the plurality of UP and DOWN memory slices.

16. The memory device of claim 15, wherein each of the xN, x2N and x4N DDR and QDR write modes are burst-2 or burst-4 write modes.

17. The memory device of claim 16, wherein each of the plurality of UP and DOWN memory slices is configurable in quarters during a x4N burst-4 write mode of operation and configurable in halves during a x4N burst-2 write mode of operation.

* * * * *